(12) United States Patent
Jiong et al.

(10) Patent No.: US 12,506,025 B2
(45) Date of Patent: Dec. 23, 2025

(54) SUSCEPTOR AND METHOD OF MANUFACTURING THE SAME

(71) Applicant: SEMES CO., LTD., Cheonan-si (KR)

(72) Inventors: So Hyung Jiong, Cheonan-si (KR);
Hyung Joon Kim, Pyeongtaek-si (KR);
Jong Gun Lee, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 103 days.

(21) Appl. No.: 18/525,387

(22) Filed: Nov. 30, 2023

(65) Prior Publication Data
US 2024/0222179 A1    Jul. 4, 2024

(30) Foreign Application Priority Data
Dec. 28, 2022 (KR) .......................... 10-2022-0187727

(51) Int. Cl.
| | | |
|---|---|---|
| H01T 23/00 | (2006.01) | |
| C04B 35/645 | (2006.01) | |
| C04B 37/02 | (2006.01) | |
| H01L 21/683 | (2006.01) | |

(52) U.S. Cl.
CPC ...... *H01L 21/6833* (2013.01); *C04B 35/6455* (2013.01); *C04B 37/021* (2013.01); *C04B 2237/343* (2013.01); *C04B 2237/365* (2013.01); *C04B 2237/366* (2013.01); *C04B 2237/401* (2013.01); *C04B 2237/402* (2013.01); *C04B 2237/403* (2013.01); *C04B 2237/406* (2013.01)

(58) Field of Classification Search
CPC .................................................. H01L 21/6833
See application file for complete search history.

(56) References Cited

U.S. PATENT DOCUMENTS

| | | | |
|---|---|---|---|
| 6,606,234 B1 | 8/2003 | Divakar | |
| 6,982,125 B2 * | 1/2006 | LaCourse | C04B 35/645 |
| | | | 501/98.5 |
| 7,935,167 B2 * | 5/2011 | Miyajima | C04B 35/589 |
| | | | 422/177 |
| 11,456,161 B2 | 9/2022 | Larosa et al. | |
| 11,715,652 B2 | 8/2023 | Ishikawa et al. | |

(Continued)

FOREIGN PATENT DOCUMENTS

| | | | |
|---|---|---|---|
| JP | | 4959905 B2 | 6/2012 |
| KR | 10-2019-0138285 A | | 12/2019 |

(Continued)

OTHER PUBLICATIONS

Office Action dated May 22, 2024 issued by the Korean Intellectual Property Office for the corresponding Korean Patent Application No. 10-2022-0187727.

*Primary Examiner* — Stephen W Jackson
(74) *Attorney, Agent, or Firm* — Muir Patent Law, PLLC

(57) ABSTRACT

A method of manufacturing a susceptor includes preparing an electrostatic chuck (ESC) and a base plate, each including a gas channel, preparing a bush-filter assembly disposed between the gas channel in the ESC and the gas channel in the base plate, and coupling the ESC to the base plate in such a manner that a portion of the bush-filter assembly is accommodated in a first accommodation part formed in a surface of the ESC and that a remaining portion of the bush-filter assembly is at least partially accommodated in a second accommodation part formed in a surface of the base plate.

20 Claims, 8 Drawing Sheets

(56) References Cited

U.S. PATENT DOCUMENTS

| | | | |
|---|---|---|---|
| 2013/0286532 A1* | 10/2013 | Kataigi | ............... H01L 21/6833 |
| | | | 361/234 |
| 2022/0148903 A1 | 5/2022 | Wang et al. | |
| 2023/0241731 A1* | 8/2023 | Chadha | ............. H01L 21/67248 |
| | | | 361/234 |
| 2024/0195332 A1 | 6/2024 | Akabane | |

FOREIGN PATENT DOCUMENTS

| KR | 10-2020-0036791 A | 4/2020 |
|---|---|---|
| KR | 10-2021-0117338 A | 9/2021 |
| KR | 10-2022-0069341 A | 5/2022 |
| WO | 2022-202147 A1 | 9/2022 |

* cited by examiner

SUSCEPTOR AND METHOD OF MANUFACTURING THE SAME

CROSS-REFERENCE TO RELATED PATENT APPLICATION

This application claims the benefit of Korean Patent Application No. 10-2022-0187727, filed on Dec. 28, 2022, in the Korean Intellectual Property Office, the disclosure of which is incorporated herein in its entirety by reference.

BACKGROUND OF THE DISCLOSURE

1. Field of the Disclosure

The present disclosure relates to a susceptor and, more particularly, to a susceptor mounted in a substrate processing apparatus for manufacturing semiconductor devices so as to support a substrate, and a method of manufacturing the susceptor.

2. Description of the Related Art

A substrate processing apparatus used for a deposition process or an etching process among semiconductor device manufacturing processes include a susceptor on which a substrate is seated and supported during the process. The susceptor may include an electrostatic chuck (ESC). The ESC may adsorb and chuck the substrate on the surface by using electrostatic force. The electrostatic force may be generated by applying a voltage to an electrode embedded in the ESC. The ESC may be widely used in, for example, a high vacuum environment to which an existing vacuum chuck is not easily applicable. Currently, to increase productivity in the etching process, bias power applied to the susceptor is gradually increasing overall from about 30 kW to about 60 kW or more. As such, an ESC structure applicable to next-generation processes is required.

According to an existing ESC, a coupling method using an adhesive is commonly used to bond a filter in the vicinity of a gas channel or bond an ESC to a base plate. In this method, a certain component of the adhesive distributed in the vicinity of the gas channel may be vaporized. The component vaporized from the adhesive may cause arcing in the gas channel. The arcing problem increases as the bias power applied to the susceptor increases. In addition, the component vaporized from the adhesive may move along the gas channel to contaminate the gas channel and a backside of the substrate, thereby deteriorating the substrate chucked on the ESC. Furthermore, the adhesive used to couple elements to each other forms an interface layer between the elements, and the interface layer is present as a gap to hinder withstand voltage function enhancement.

SUMMARY OF THE DISCLOSURE

The present disclosure provides a susceptor capable of effectively reducing problems caused by an adhesive layer by coupling a filter disposed on a gas channel inside the susceptor to a bush for accommodating the filter or coupling a bush-filter assembly to an electrostatic chuck (ESC) through co-sintering without using an adhesive. However, the above description is an example, and the scope of the present disclosure is not limited thereto.

According to an aspect of the present disclosure, there is provided method of manufacturing a susceptor.

The method includes preparing an electrostatic chuck (ESC) and a base plate, each including a gas channel, preparing a bush-filter assembly disposed between the gas channel in the ESC and the gas channel in the base plate, and coupling the ESC to the base plate in such a manner that a portion of the bush-filter assembly is accommodated in a first accommodation part formed in a surface of the ESC and that a remaining portion of the bush-filter assembly is at least partially accommodated in a second accommodation part formed in a surface of the base plate.

The preparing of the bush-filter assembly may include preparing a filter preform used to form a porous filter, preparing a bush preform including a filter accommodation part capable of accommodating the filter preform, and forming the bush-filter assembly which is an integrated sintered body in which a filter is sinter-bonded to a bush in the filter accommodation part, by accommodating the filter preform in the filter accommodation part of the bush preform and performing co-sintering.

The bush and the filter may be made of ceramic materials with the same main component.

The ceramic materials may include at least one of aluminum oxide ($Al_2O_3$), aluminum nitride (AlN), silicon carbide (SiC), and aluminum oxide-silicon carbide ($Al_2O_3$—SiC) composite.

The filter preform may include a pore former.

The forming of the bush-filter assembly may include converting the filter preform into a porous sintered body by removing the pore former in the filter preform.

The forming of the bush-filter assembly may include converting the bush preform into a dense sintered body including no pores.

The co-sintering may include pressureless sintering or pressure sintering.

The pressure sintering may include hot isostatic pressing or hot pressing.

In the bush-filter assembly, an interface between the bush and the filter may be formed by directly sinter-bonding the ESC to the bush without using an adhesive layer made of a heterogeneous material.

The filter accommodation part may have a countersink or counterbore shape.

The bush preform may include a gas channel through which a gas flows, and a side of the gas channel may be connected to the filter accommodation part.

The bush preform may include a gas channel through which a gas flows, and a side of the gas channel may be connected to the first accommodation part.

The coupling of the ESC to the base plate may include coupling the ESC to the base plate by using an adhesive.

The adhesive may include at least one of silicone-based resin composition, epoxy, and acrylic.

The base plate may include at least one of aluminum (Al) and alloys thereof, titanium (Ti) and alloys thereof, stainless steel, and aluminum-silicon carbide (Al—SiC) composites.

According to another aspect of the present disclosure, there is provided a method of manufacturing a susceptor, the method including preparing an electrostatic chuck (ESC)-bush-filter assembly in which a portion of a bush-filter assembly is accommodated in and coupled to a first accommodation part formed in a surface of an ESC, preparing a base plate including a second accommodation part formed in a surface, coupling the ESC to the base plate in such a manner that a remaining portion of the bush-filter assembly not accommodated in the first accommodation part formed in the ESC is at least partially accommodated in the second accommodation part formed in the base plate.

The preparing of the ESC-bush-filter assembly may include preparing an ESC preform including the first accommodation part formed in a surface, preparing a filter preform used to form a porous filter, preparing a bush preform including a filter accommodation part formed in a surface to accommodate the filter preform, and forming the ESC-bush-filter assembly which is a sintered body in which the ESC, a bush, and a filter are integrated with each other, by accommodating the bush preform in which the filter preform is accommodated in the filter accommodation part, in the first accommodation part and then performing co-sintering.

The ESC, the bush, and the filter may be made of ceramic materials with the same main component.

The forming of the ESC-bush-filter assembly may include converting the filter preform into a porous sintered body by removing the pore former in the filter preform.

The forming of the ESC-bush-filter assembly may include converting the ESC preform and the bush preform into dense sintered bodies including no pores.

According to another aspect of the present disclosure, there is provided a susceptor.

The susceptor includes an electrostatic chuck (ESC) for chucking a substrate by using electrostatic force, and including a first accommodation part formed in a surface opposite to a surface on which the substrate is chucked, and a gas channel connected to the first accommodation part, a base plate coupled to the surface of the ESC in which the first accommodation part is formed, and including a second accommodation part formed at a position corresponding to the first accommodation part of the ESC, and a gas channel connected to the second accommodation part, a bush-filter assembly disposed between the gas channel formed in the ESC and the gas channel formed in the base plate, and an adhesive layer disposed between the ESC and the base plate to couple the ESC to the base plate.

The bush-filter assembly may include a bush provided as a dense ceramic sintered body including a gas channel through which a gas flows, and a filter accommodation part formed at a side of the gas channel to accommodate a filter, and the filter provided as a porous ceramic sintered body through which a gas passes, and at least partially accommodated in the filter accommodation part so as to be sinter-bonded to and integrated with the bush, the bush and the filter may be made of ceramic materials with the same main component, a portion of the bush-filter assembly may be accommodated in the first accommodation part formed in the ESC so as to be coupled to the ESC, and a remaining portion of the bush-filter assembly may be at least partially accommodated in and coupled to the second accommodation part formed in the base plate, and an interface between the bush and the filter may be formed by directly sinter-bonding the bush to the filter without using an adhesive layer made of a heterogeneous material.

BRIEF DESCRIPTION OF THE DRAWINGS

The above and other features and advantages of the present disclosure will become more apparent by describing in detail embodiments thereof with reference to the attached drawings in which.

DETAILED DESCRIPTION OF THE DISCLOSURE

Figure 1:
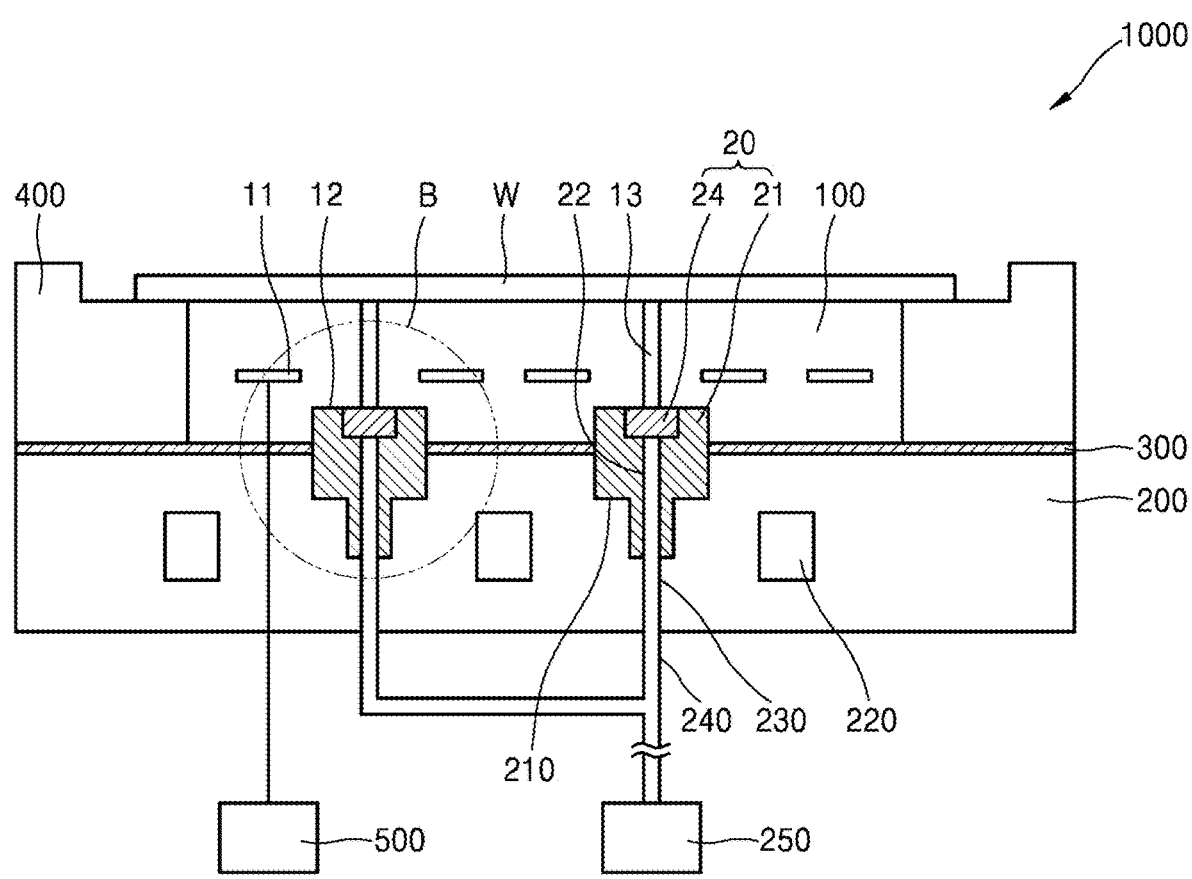
FIG. 1 is a cross-sectional view of a susceptor according to an embodiment of the present disclosure.

Hereinafter, the present disclosure will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses or sizes of layers are exaggerated for clarity and convenience of explanation.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing.

FIG. 1 is a cross-sectional view of a susceptor 1000 according to an embodiment of the present disclosure.

Referring to FIG. 1, the susceptor 1000 may include an electrostatic chuck (ESC) 100, a base plate 200, an adhesive layer 300, and a focus ring 400.

The ESC 100 may adsorb and fix a substrate W, e.g., a silicon wafer, onto the surface thereof by using electrostatic force. The ESC 100 may be provided in a shape substantially corresponding to the substrate W to seat the substrate W on an upper surface thereof by using electrostatic force. The ESC 100 may be made of a ceramic material. For example, the ceramic material may include at least one of aluminum oxide ($Al_2O_3$), aluminum nitride (AlN), silicon carbide (SiC), and aluminum oxide-silicon carbide ($Al_2O_3$—SiC) composite.

The ESC 100 may include at least one electrode 11 buried inside. The electrode 11 may include a plurality of electrodes spaced apart from each other by a certain distance in the ESC 100, or one electrode having a shape corresponding to the ESC 100. The electrode 11 may be made of various conductive materials including metal materials, e.g., copper (Cu), aluminum (Al), tungsten (W), and molybdenum (Mo).

The electrode 11 may be electrically connected to a power supply 500 including a direct current power source, such that the substrate W may be chucked on the upper surface of the ESC 100 by electrostatic adsorption when a voltage is applied from the power supply 500.

A first accommodation part 12 capable of accommodating a bush-filter assembly 20 is formed in a surface of the ESC 100. The first accommodation part 12 may be formed in a circular cylinder shape, but is not limited thereto and may be formed in various shapes including polygonal cylinder shapes. For example, the first accommodation part 12 may be formed as an indentation in a portion of the surface of the ESC 100.

The bush-filter assembly 20 is accommodated in and coupled to the first accommodation part 12. The ESC 100 includes a gas channel 13 connected to a filter 24 of the bush-filter assembly 20. An end of the gas channel 13 extends to the surface of the ESC 100 and is provided under a backside of the substrate W chucked on the surface of the ESC 100.

As a cooling medium, a gas flows through a space (not shown) between the substrate W and the ESC 100 to cool the substrate W. For example, the gas may include helium, nitrogen, or argon.

The bush-filter assembly 20 is a structure in which the filter 24 made of a porous material through which a gas may pass is coupled to a bush 21 capable of accommodating the filter 24. A description thereof will be provided below.

The base plate 200 is coupled to the surface of the ESC 100. The base plate 200 may be provided to control the temperature of the ESC 100. The base plate 200 may be provided in a shape substantially corresponding to the ESC 100, and coupled to the ESC 100 by the ESC 100 and the adhesive layer 300.

A second accommodation part 210 for accommodating the bush-filter assembly 20 is formed in a surface of the base plate 200. The second accommodation part 210 may be formed at a position corresponding to the first accommodation part 12 of the ESC 100. For example, the second accommodation part 210 may have a form of an indentation formed at the position corresponding to the first accommodation part 12 in the surface of the base plate 200.

The bush-filter assembly 20 accommodated in the second accommodation part 210 may be coupled to the base plate 200 in the second accommodation part 210 by an adhesive.

The base plate 200 may include at least one gas channel 230 in which the gas may move through the base plate 200. The gas channel 230 may be connected to a gas supply line 240 to receive the gas from a gas supplier 250 through the gas supply line 240. The gas supplied from the gas supplier 250 moves through the gas channel 230 in the base plate 200 and is connected to a gas channel 22 formed in the bush 21 at the bottom of the second accommodation part 210. The gas having passed through the gas channel 22 is supplied to the filter 24, and the gas having passed the filter 24 moves through the gas channel 13 formed in the ESC 100 and is supplied to the backside of the substrate W.

The base plate 200 may include a metal material with high thermal conductivity, e.g., at least one of aluminum (Al) and alloys thereof, titanium (Ti) and alloys thereof, stainless steel, and aluminum-silicon carbide (Al—SiC) composites. The base plate 200 may include a refrigerant passage 220. For example, the refrigerant passage 220 may be formed in a spiral shape. The refrigerant passage 220 may be provided as a passage through which a refrigerant circulates. The ESC 100 may be cooled using the refrigerant circulating through the refrigerant passage 220.

The adhesive layer 300 may be disposed between the ESC 100 and the base plate 200 to couple the ESC 100 to the base plate 200. The adhesive layer 300 may include a polymer material, e.g., silicone-based resin composition, epoxy, or acrylic. The adhesive layer 300 may further include a material with high thermal conductivity, e.g., aluminum (Al), aluminum nitride (AlN), or graphite, as a filler to increase thermal conductivity.

The focus ring 400 may be provided in a ring shape along the edge of the ESC 100. For example, the focus ring 400 may have a level difference between an inner portion provided at the same height as the ESC 100 and an outer portion provided to be higher than the inner portion. The focus ring 400 may be configured in such a manner that the inner portion at least partially supports a lower surface of the substrate W and the outer portion surrounds the edge of the substrate W. The focus ring 400 enables uniform plasma formation over the entire region of the substrate W for various processes of the substrate W including an etching process.

Figure 2:
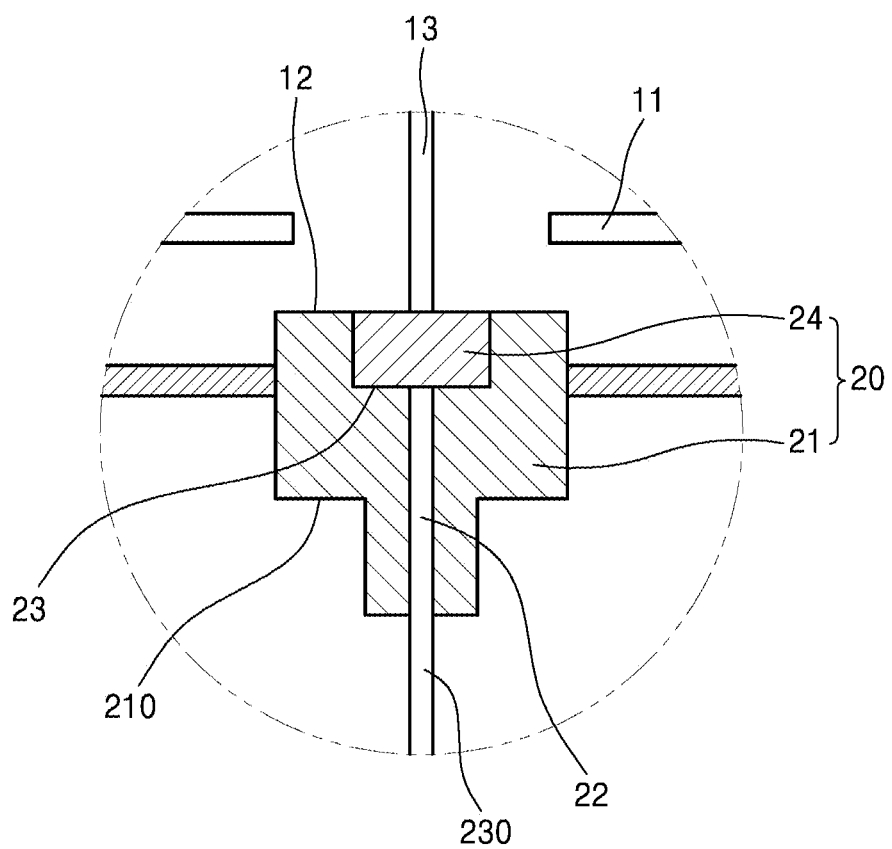
FIG. 2 is an enlarged view of portion "B" of FIG. 1.

FIG. 2 is an enlarged view of portion "B" of FIG. 1 and, more specifically, an enlarged cross-sectional view of the bush-filter assembly 20, a portion of which is accommodated in the first accommodation part 12 of the ESC 100 and a remaining portion of which is accommodated in the second accommodation part 210 of the base plate 200, according to an embodiment of the present disclosure.

Referring to FIG. 2, the bush-filter assembly 20 has a structure in which the bush 21 is coupled to the filter 24.

The filter 24 is made of a porous ceramic material including fine pores to allow a gas to pass through. The filter 24 may have a porosity ranging from 30% to 80% by volume. The filter 24 is disposed between the gas channel 13 formed in the ESC 100 and the gas channel 22 formed in the bush 21 and connected to the gas channel 230 penetrating through the base plate 200.

The filter 24 is provided to suppress arcing in a gas channel for supplying a cooling gas to the backside of the substrate W while the substrate W seated on the surface of the ESC 100 is processed by plasma in a substrate processing apparatus.

The filter 24 may be made of a ceramic material. For example, the ceramic material may include at least one of $Al_2O_3$, AlN, SiC, and $Al_2O_3$—SiC composite.

The bush 21 may include the gas channel 22 in which the gas may flow, and a filter accommodation part 23 in which the filter 24 is accommodated is formed at a side of the gas channel 22. For example, the filter accommodation part 23 may have a countersink or counterbore shape.

FIG. 2 shows an example of the bush 21 having the filter accommodation part 23 of a counterbore shape. Therefore, at least a portion of the filter 24 accommodated in the filter accommodation part 23 is surrounded by the filter accommodation part 23 of the bush 12. The bottom of the filter accommodation part 23 is connected to the gas channel 22.

The bush 12 may prevent dielectric breakdown of the filter 24 by accommodating and surrounding the filter 24 which has low dielectric strength characteristics due to the porous structure.

The bush 21 may be made of a ceramic material. For example, the ceramic material may include at least one of $Al_2O_3$, AlN, SiC, and $Al_2O_3$—SiC composite.

According to the present disclosure, instead of an existing filter-bush coupling method using an adhesive, a filter is directly coupled to a bush through co-sintering. As such, the filter and the bush are formed as one body by sinter-bonding without providing an adhesive between the two. Herein, when the filter and the bush are "formed as one body", it means that an adhesive layer made of a heterogeneous material is not present between the filter and the bush and that the filter and the bush are directly coupled to each other. Herein, the heterogeneous material means a material different from those of the filter and the bush.

In this case, the filter and the bush are made of homogeneous ceramic materials with the same main component. The ceramic materials with the same main component may include a common ceramic component in a range greater than 50 wt % and less than or equal to 100 wt %, specifically, in a range greater than or equal to 70 wt % and less than or equal to 100 wt % and, more specifically, in a range greater than or equal to 90 wt % and less than or equal to 100 wt %. For example, each of the filter and the bush may be made of a ceramic material including more than 50 wt % of $Al_2O_3$ based on a total weight. Preferably, the filter and the bush may be made of a ceramic material with substantially the same composition, e.g., $Al_2O_3$.

Using the co-sintering method, a bush preform and a filter preform may be prepared separately, coupled to each other, and then co-sintered at high temperature in a heat treatment furnace, thereby ultimately forming a bush-filter assembly which is a sintered body in which a bush and a filter are coupled into one body.

Figure 3:
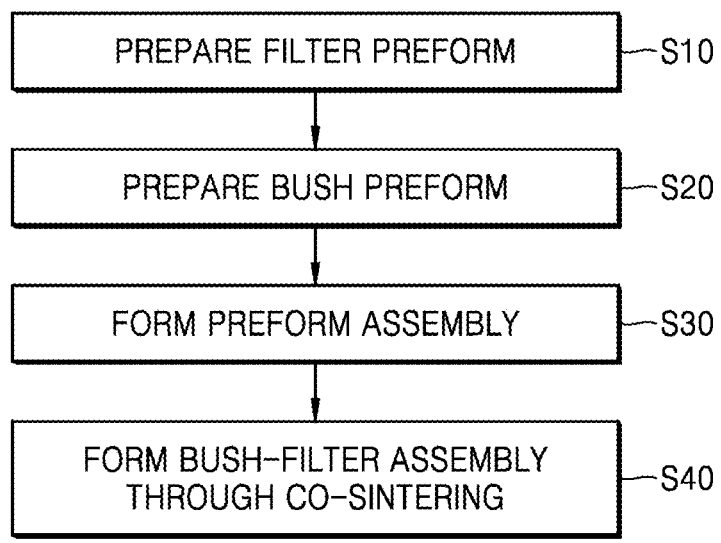
FIG. 3 is a flowchart of a method of forming a bush-filter assembly, according to an embodiment of the present disclosure.
Figure 4:
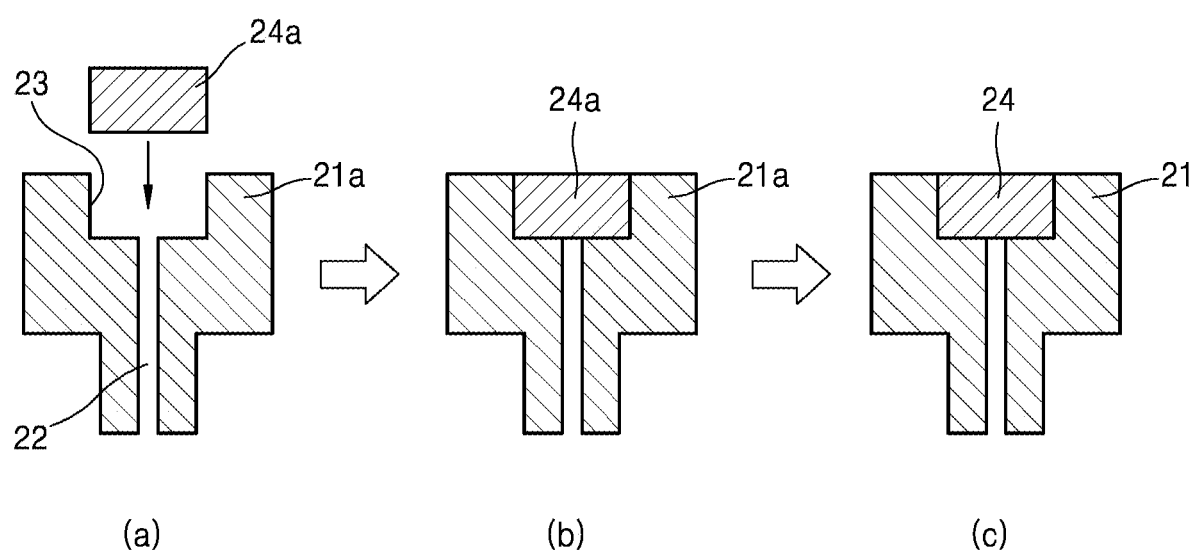
FIG. 4 shows a structure based on each step of a method of forming a bush-filter assembly, according to an embodiment of the present disclosure.

FIG. 3 is a flowchart of a method of forming a bush-filter assembly, according to an embodiment of the present disclosure. FIG. 4 shows a structure based on each step of the method of FIG. 3.

Referring to FIG. 3, a filter preform 24a is prepared (S10) and a bush preform 21a is prepared (S20). Herein, a preform is a preliminary structure for forming a sintered body and refers to a certain-shaped structure formed by putting and pressing ceramic powder in a mold. FIG. 4(a) shows the filter preform 24a, and the bush preform 21a including the filter accommodation part 23 and the gas channel 22.

The filter preform 24a is converted into the filter 24, which is a porous sintered body, after being sintered. The filter preform 24a may include a pore former to form pores in the sintered body. The pore former may include a polymer material or hollow microspheres that are thermally decomposed and vaporized during the sintering step. As the pore former is removed in the sintering step, the filter 24 which is an ultimate sintered body has a porous structure.

The bush preform 21a is converted into the bush 21 including the filter accommodation part 23 capable of accommodating the filter 24, after being sintered. The bush preform 21a has substantially the same shape as that of the bush 21 described above in relation to FIG. 2, and thus a description thereof is not provided herein.

The filter preform 24a and the bush preform 21a may be prepared using homogeneous ceramic powders. The homogeneous ceramic powders refer to ceramic powders with the same main component. For example, the ceramic powders having the highest wt % in total compositions may be the same, and sintering aids and various additives added in small amounts, e.g., a pore former, may differ in content.

Then, a bush preform 21a-filter preform 24a assembly is formed by accommodating the filter preform 24a in the filter accommodation part 23 of the bush preform 21a (S30). FIG. 4(b) shows the bush preform 21a-filter preform 24a assembly. In this case, the filter preform 24a is physically coupled to the bush preform 21a.

Then, the bush preform 21a-filter preform 24a assembly is co-sintered at high temperature in a heat treatment furnace to simultaneously convert the filter preform 24a and the bush preform 21a into sintered bodies. The filter preform 24a and the bush preform 21a are sintered and converted into the filter 24 and the bush 21, respectively. FIG. 4(c) shows a bush-filter assembly.

Sintering also occurs between the powders at the coupled portions of the filter preform 24a and the bush preform 21a during the co-sintering process and thus the coupled portions of the two preforms 24a and 21a are converted into a sinter-bonded portion. That is, sintering accompanied by diffusion of atoms also occurs between the powders at an interface between the filter preform 24a and the bush preform 21a at high temperature and thus the two structures are integrated with each other.

Because the filter preform 24a includes a pore former, the pore former is vaporized and removed during the sintering process and the filter preform 24a is converted into the filter 24 which is a porous sintered body. On the other hand, the bush preform 21a is converted into a dense ceramic sintered body which is normally obtained when sintering occurs between the powders.

Therefore, the bush-filter assembly formed after the sintering is completed has a structure in which a porous filter including a plurality of pores and a dense bush including no pores are sinter-bonded to each other.

The co-sintering may use both pressureless sintering and pressure sintering.

The pressureless sintering is performed at an atmospheric pressure or in an inert atmosphere and may reduce the purity of a sintered body because sintering aids are added in large amounts. In the pressureless sintering, a sintered body may be formed through appropriate temperature and time control in a heat treatment furnace.

The pressure sintering is a method of performing sintering by applying a pressure from the outside, and may obtain a dense sintered body within a shorter time compared to the pressureless sintering and thus obtain a denser and harder sintered body compared to the pressureless sintering. In addition, because sintering aids are added in small amounts compared to the pressureless sintering, a sintered body with a higher purity may be obtained.

The pressure sintering may include hot isostatic pressing (HIP) or hot pressing.

According to the present disclosure, because a filter and a bush made of materials with a common main component are directly coupled to each other, unlike an existing coupling method using an adhesive, an interface layer made of a heterogeneous material different from that of the bush or the filter is not formed.

When the filter is coupled to the bush by using an adhesive as in the existing method, an adhesive layer normally including an organic material is formed at an interface between the filter and the bush. The adhesive layer corresponds to a gap between the filter and the bush, and thus a potential difference occurs between the filter and the bush with respect to the adhesive layer, thereby deteriorating a withstand voltage function of ESC.

On the other hand, according to the present disclosure, because the filter and the bush are coupled into one body in the sintering step by the diffusion between homogeneous materials at the interface between the filter and the bush, an interface layer made of a heterogeneous material is not formed at the interface. Preferably, when the filter and the bush are made of the same ceramic material, a bush-filter assembly obtained through sintering in a high-temperature pressure environment may be an integrated element made of one material. Therefore, because the potential difference at the interface according to the existing method does not occur, the deterioration of the withstand voltage function of ESC which is caused when the adhesive layer is used may be solved.

In addition, according to the existing method, a certain material, e.g., an organic material having a low boiling point, may be vaporized from the adhesive layer formed between the filter and the bush to contaminate a gas channel and a substrate. However, according to the present disclosure, because no adhesive layer is present between the filter and the bush, the above problem caused by the vaporization of a certain material in the adhesive layer does not occur.

Figure 5:
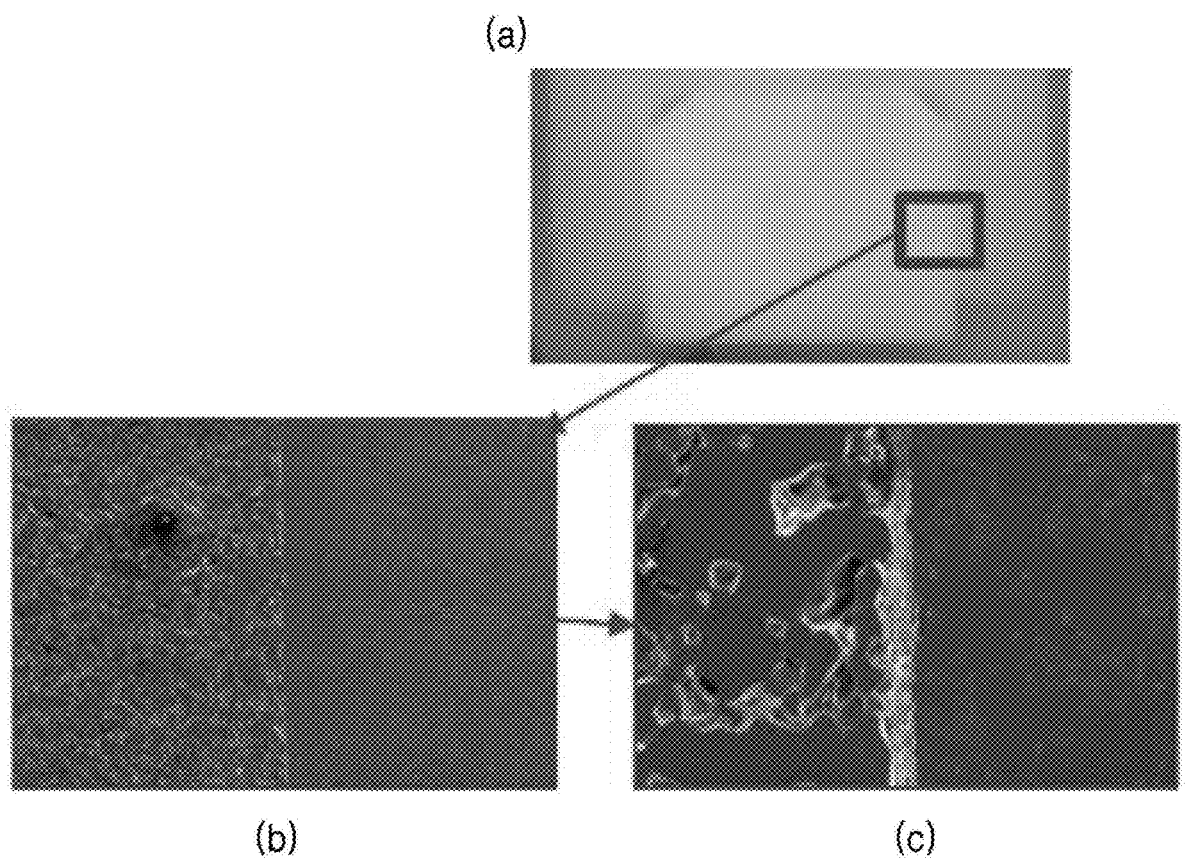
FIG. 5 includes electron microscope images at a bush-filter interface of a bush-filter assembly formed according to an embodiment of the present disclosure.

FIG. 5 includes electron microscope images at a bush-filter interface of a bush-filter assembly formed by preparing a filter preform and a bush preform by using the same $Al_2O_3$ powder, coupling the filter preform to the bush preform, and then performing co-sintering through hot isostatic pressing.

Referring to FIG. 5, FIG. 5(a) shows the exterior of the formed bush-filter assembly, FIG. 5(b) is an enlarged image of a bush-filter interfacial region (see a rectangular portion) of FIG. 5(a), and FIG. 5(c) is a further enlarged image of the rectangular portion of FIG. 5(b). Referring to (a) to (c) of FIG. 5, it is shown that a bush is directly bonded to a filter without an adhesive layer and thus an interface is formed without forming a gap by the adhesive layer.

Figure 6:
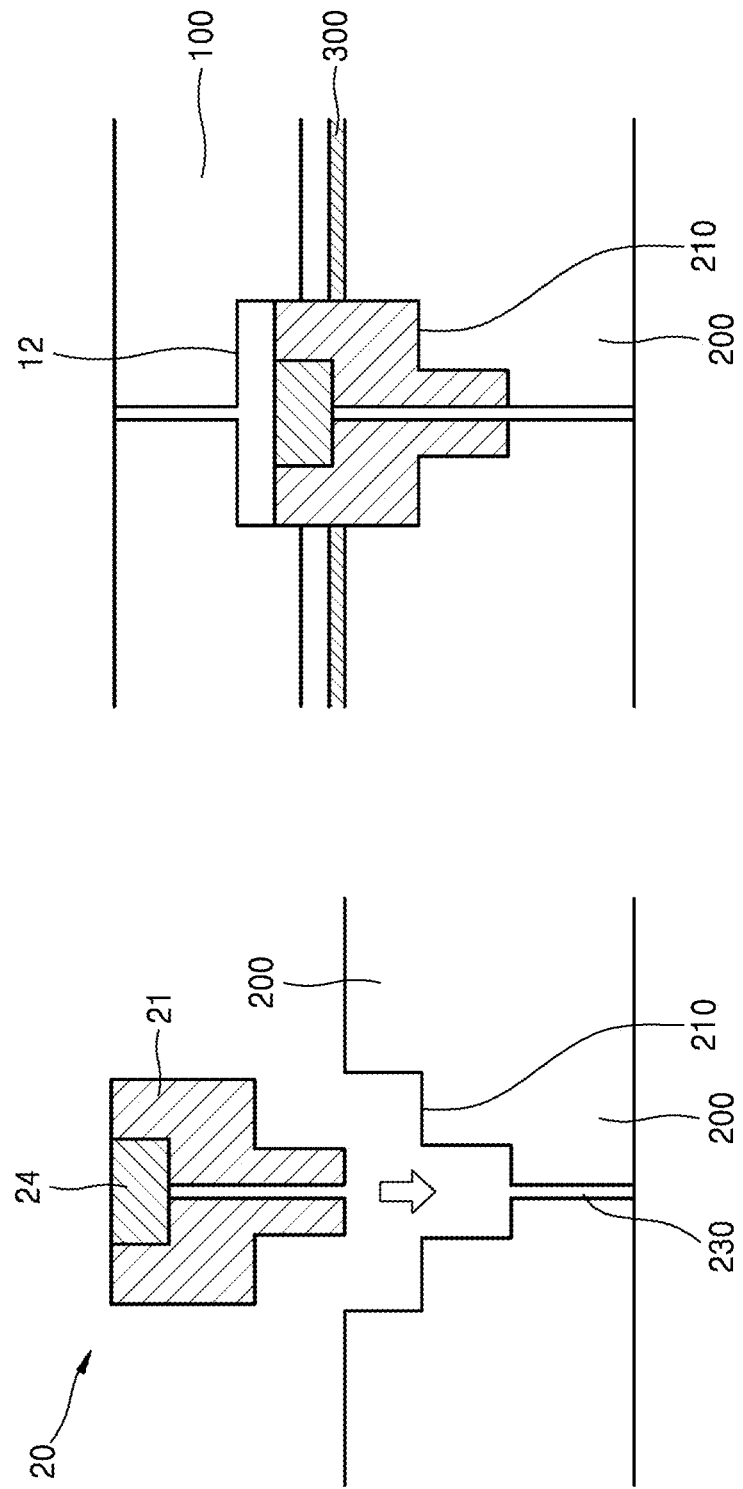
FIG. 6 shows an example of a step of coupling a bush-filter assembly to a base plate and an electrostatic chuck (ESC) after the bush-filter assembly is formed.

FIG. 6 shows an example of a step of coupling the bush-filter assembly 20 to the base plate 200 and the ESC 100 after the bush-filter assembly 20 is formed. Referring to FIG. 6(a), the bush-filter assembly 20 is inserted into the second accommodation part 210 of the base plate 200 and then is coupled to the base plate 200. In the second accommodation part 210, the base plate 200 may be coupled to the bush-filter assembly 20 by an adhesive. The adhesive may include, for example, silicone-based resin composition, epoxy, or acrylic.

FIG. 6(b) shows a process of coupling a remaining portion of the bush-filter assembly 20 not accommodated in the second accommodation part 210 of the base plate 200, into the first accommodation part 12 of the ESC 100 after the bush-filter assembly 20 is coupled to the second accommodation part 210 of the base plate 200. Referring to FIG. 6(b), the remaining portion of the bush-filter assembly 20 not accommodated in the second accommodation part 210 of the base plate 200 is at least partially inserted into the first accommodation part 12 of the ESC 100, and then the bush-filter assembly 20 is coupled to the ESC 100. In this case, the adhesive layer 300 may be disposed between the ESC 100 and the base plate 200 to couple the ESC 100 to the base plate 200. Ultimately, when the ESC 100 is coupled to the base plate 200, the structure shown in FIG. 2 is obtained.

In the first accommodation part 12, the ESC 100 may be coupled to the bush-filter assembly 20 by an adhesive. The adhesive may include, for example, silicone-based resin composition, epoxy, or acrylic.

The method shown in FIG. 6 is an example. The bush-filter assembly 20 may be accommodated in the first accommodation part 12 of the ESC 100 and then accommodated in the second accommodation part 210 of the base plate 200, or simultaneously accommodated in and then coupled to the first accommodation part 12 of the ESC 100 and the second accommodation part 210 of the base plate 200.

According to a modified embodiment of the present disclosure, when the filter 24, the bush 21, and the ESC 100 are made of ceramic materials with the same main component, an integrated sintered body may be formed by co-sintering the filter 24, the bush 21, and the ESC 100.

Figure 7:
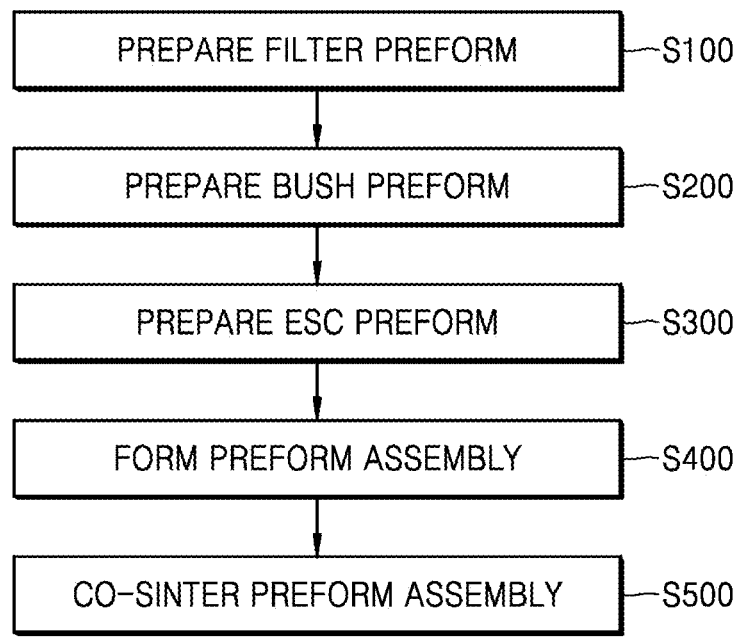
FIG. 7 is a flowchart of a method of integrating an ESC, a bush, and a filter with each other, according to a modified embodiment of the present disclosure.
Figure 8:
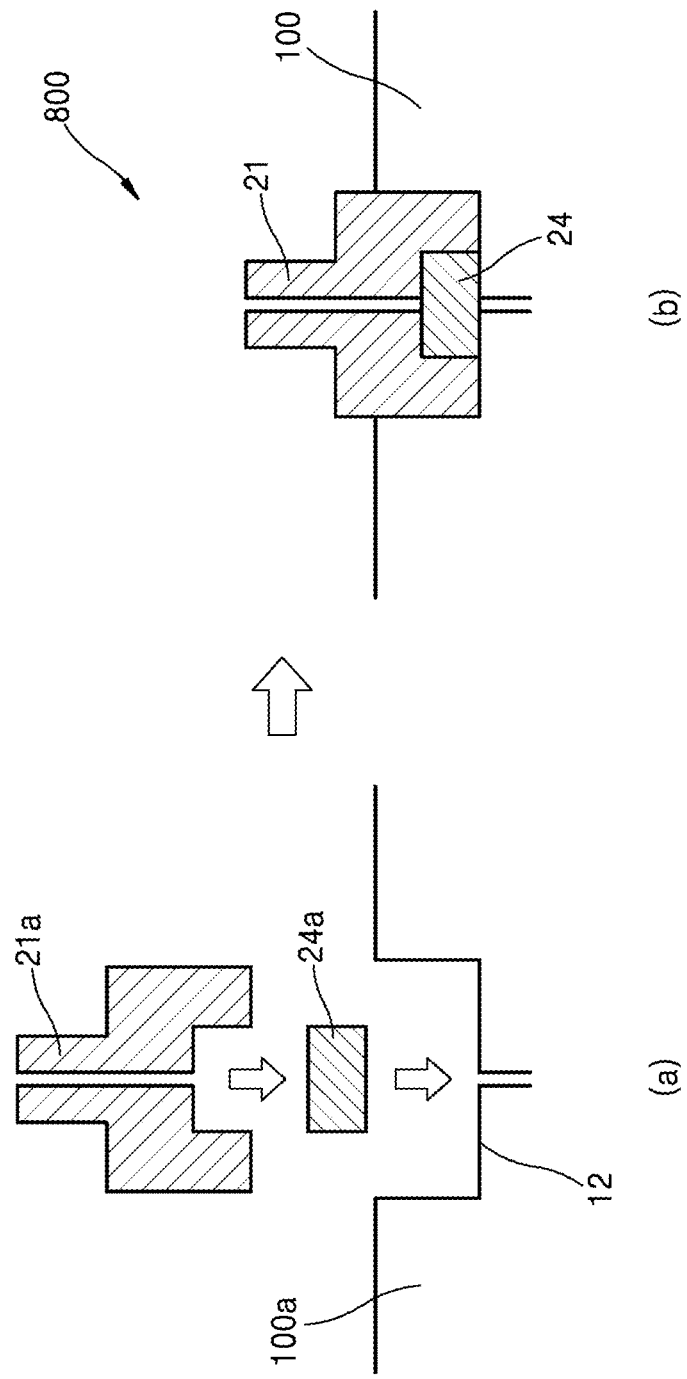
FIG. 8 shows a structure based on each step of a method of integrating an ESC, a bush, and a filter with each other, according to a modified embodiment of the present disclosure.

FIG. 7 is a flowchart of a method of integrating the ESC 100, the bush 21, and the filter 24 with each other, according to a modified embodiment of the present disclosure. FIG. 8 shows a structure based on each step of the method of FIG. 7. For convenience's sake, the descriptions provided above are not repeated herein.

Referring to FIG. 7, a filter preform 24a is prepared (S100), a bush preform 21a is prepared (S200), and an ESC preform 100a is prepared (S300).

Then, a preform assembly is formed by coupling the filter preform 24a, the bush preform 21a, and the ESC preform 100a to each other (S400). That is, the bush preform 21a in which the filter preform 24a is accommodated in the filter accommodation part 23 is accommodated in and coupled to the first accommodation part 12.

FIG. 8(a) shows a structure in which the filter preform 24a, the bush preform 21a, and the ESC preform 100a are coupled to each other.

Then, the assembly of the filter preform 24a, the bush preform 21a, and the ESC preform 100a is co-sintered at high temperature in a heat treatment furnace to simultaneously convert the filter preform 24a, the bush preform 21a, and the ESC preform 100a into sintered bodies (S500).

In this process, an integrated sintered body in which the filter 24, the bush 21, and the ESC 100 are coupled to each other is formed. This sintered body is called an ESC-bush-filter assembly 800.

FIG. 8(b) shows the ESC-bush-filter assembly 800 which is an integrated sintered body in which the filter 24, the bush 21, and the ESC 100 are coupled to each other.

After the bush-filter assembly 20 is coupled into the first accommodation part 12 of the ESC 100 as described above, the ESC-bush-filter assembly 800 is coupled to the base plate 200 by using an adhesive. That is, a portion of the bush-filter assembly 20 integrated with the ESC 100 is aligned to be accommodated in the second accommodation part 210 of the base plate 200, the bush-filter assembly 20 is inserted into the second accommodation part 210, and then the ESC 100 is coupled to the base plate 200 by using the adhesive layer 300 while coupling the bush-filter assembly 20 to the second accommodation part 210 of the base plate 200.

When a bush-filter assembly is coupled to an ESC by co-sintering as described above, because an interface between the ESC and the bush and an interface between the bush and the filter are both formed by sintering, an adhesive layer is not present at least in the ESC. Therefore, the above-described problems, e.g., arching caused by an adhesive layer, contamination caused by an adhesive component, and a low dielectric strength of the filter, are solved more effectively. Furthermore, because the ESC, the bush, and the filter are integrated with each other through a single sintering process, production costs may be reduced through process simplification.

Referring to FIG. 2, the bush 21 may be coupled to the filter 24 in such a manner that a top surface of the filter 24 accommodated in the filter accommodation part 23 of the bush 21 corresponds to a top surface of the bush 21. Herein, upper and lower surfaces are relative terms and, in the susceptor 1000, a direction from the base plate 200 to the ESC 100 is defined as an upward direction and a direction opposite to the upward direction is defined as a downward direction. Therefore, the top surfaces of the bush 21 and the filter 24 refer to uppermost surfaces of the bush 21 and the filter 24 toward the ESC 100. This means that distances from a bottom surface of the filter accommodation part 23 to the top surfaces of the bush 21 and the filter 24 are the same. Thus, in this case, the top surface of the filter 24 means a top surface of the bush-filter assembly 20.

However, the present disclosure is not limited thereto. The distance from the bottom surface of the filter accommodation part to the top surface of the bush may be greater than that to the top surface of the filter, and thus the top surface of the filter may be positioned lower than the top surface of the bush. In this case, the filter is fully accommodated in the filter accommodation part of the bush and the top surface of the filter is positioned in the filter accommodation part. As another example, the distance from the bottom surface of the filter accommodation part to the top surface of the bush may be less than that to the top surface of the filter, and thus the top surface of the filter may be positioned higher than the top surface of the bush. In this case, the filter is not fully accommodated in the filter accommodation part of the bush and a portion of the filter may protrude upward from the top surface of the bush.

Referring to FIGS. 1 and 2, the top surface of the bush-filter assembly 20 accommodated in the first accommodation part 12 of the ESC 100 is positioned higher than the adhesive layer 300. This means that a distance from a top surface of the ESC 100, i.e., a surface on which the substrate W is chucked, to a bottom surface of the ESC 100 is greater than a distance from the top surface of the ESC 100 to the top surface of the bush-filter assembly 20.

In addition, because a portion of the bush-filter assembly 20 is accommodated in the second accommodation part 210 formed in the base plate 200 positioned lower than the adhesive layer 300, the bush-filter assembly 20 is disposed to penetrate though the adhesive layer 300 from top to bottom. Therefore, an end of the adhesive layer 300 cut by the bush-filter assembly 20 is in direct contact with a side surface of the bush 21 of the bush-filter assembly 20. That is, the bush-filter assembly 20 is formed across the adhesive layer 300 from the ESC 100 to the base plate 200, and thus the end of the adhesive layer 300 is formed on the side surface of the bush 21 of the bush-filter assembly 20. Accordingly, the bush 21 serves as a blocker for blocking direct contact between the adhesive layer 300 and the filter 24.

Due to the above-described structure, the adhesive layer 300 is not present in a region where the gas channel 230 of the base plate 200 is in direct contact with the gas channel 13 formed in the ESC 100.

The gas supplied from the gas supplier 250 moves through the gas channel 230 in the base plate 200 and is connected to the gas channel 22 of the bush-filter assembly 20 at the bottom of the second accommodation part 210 so as to be supplied to the filter 24, and the gas having passed through the filter 24 moves through the gas channel 13 of the ESC 100 so as to be supplied to the backside of the substrate W.

According to the present disclosure, because an adhesive layer is not formed at the interface between the bush 21 and the filter 24, the gas provided from the gas channel 230 in the base plate 200 is not in direct contact with the adhesive layer while moving through the filter 24 and the gas channel 22 of the bush-filter assembly 20. Therefore, problems caused when a certain material is vaporized from the adhesive layer and inserted into the gas channel do not occur.

According to the afore-described embodiments of the present disclosure, problems caused when an adhesive is used, e.g., arcing in a gas channel, contamination of the gas channel and a substrate, and deterioration of a withstand voltage function of an ESC, may be solved by coupling a filter disposed on the gas channel inside a susceptor to a bush for accommodating the filter or coupling a bush-filter assembly to the ESC through co-sintering without using the adhesive. However, the scope of the present disclosure is not limited to the above effect.

While the present disclosure has been particularly shown and described with reference to embodiments thereof, it will be understood by one of ordinary skill in the art that various changes in form and details may be made therein without departing from the scope of the present disclosure as defined by the following claims.

What is claimed is:

1. A method of manufacturing a susceptor, the method comprising:
preparing an electrostatic chuck (ESC) and a base plate, each comprising a gas channel;
preparing a bush-filter assembly disposed between the gas channel in the ESC and the gas channel in the base plate; and
coupling the ESC to the base plate in such a manner that a portion of the bush-filter assembly is accommodated in a first accommodation part formed in a surface of the ESC and that a remaining portion of the bush-filter assembly is at least partially accommodated in a second accommodation part formed in a surface of the base plate,
wherein the preparing of the bush-filter assembly comprises:
preparing a filter preform used to form a porous filter;
preparing a bush preform comprising a filter accommodation part capable of accommodating the filter preform; and
forming the bush-filter assembly which is an integrated sintered body in which a filter is sinter-bonded to a bush in the filter accommodation part, by accommodating the filter preform in the filter accommodation part of the bush preform and performing co-sintering.

2. The method of claim 1, wherein the bush and the filter are made of ceramic materials with the same main component.

3. The method of claim 1, wherein the filter preform comprises a pore former.

4. The method of claim 3, wherein the forming of the bush-filter assembly comprises converting the filter preform into a porous sintered body by removing the pore former in the filter preform.

5. The method of claim 1, wherein the forming of the bush-filter assembly comprises converting the bush preform into a dense sintered body comprising no pores.

6. The method of claim 1, wherein the co-sintering comprises pressureless sintering or pressure sintering.

7. The method of claim 6, wherein the pressure sintering comprises hot isostatic pressing or hot pressing.

8. The method of claim 2, wherein the ceramic materials comprise at least one of aluminum oxide ($Al_2O_3$), aluminum nitride (AlN), silicon carbide (SiC), and aluminum oxide-silicon carbide ($Al_2O_3$—SiC) composite.

9. The method of claim 1, wherein, in the bush-filter assembly, an interface between the bush and the filter is formed by directly sinter-bonding the ESC to the bush without using an adhesive layer made of a heterogeneous material.

10. The method of claim 1, wherein the filter accommodation part has a countersink or counterbore shape.

11. The method of claim 1, wherein the bush preform comprises a gas channel through which a gas flows, and wherein a side of the gas channel is connected to the filter accommodation part.

12. The method of claim 1, wherein the coupling of the ESC to the base plate comprises coupling the ESC to the base plate by using an adhesive.

13. The method of claim 12, wherein the adhesive comprises at least one of silicone-based resin composition, epoxy, and acrylic.

14. The method of claim 1, wherein the base plate comprises at least one of aluminum (Al) and alloys thereof, titanium (Ti) and alloys thereof, stainless steel, and aluminum-silicon carbide (Al—SiC) composites.

15. A method of manufacturing a susceptor, the method comprising:
   preparing an electrostatic chuck (ESC)-bush-filter assembly in which a portion of a bush-filter assembly is accommodated in and coupled to a first accommodation part formed in a surface of an ESC;
   preparing a base plate comprising a second accommodation part formed in a surface;
   coupling the ESC to the base plate in such a manner that a remaining portion of the bush-filter assembly not accommodated in the first accommodation part formed in the ESC is at least partially accommodated in the second accommodation part formed in the base plate,
   wherein the preparing of the ESC-bush-filter assembly comprises:
   preparing an ESC preform comprising the first accommodation part formed in a surface;
   preparing a filter preform used to form a porous filter;
   preparing a bush preform comprising a filter accommodation part formed in a surface to accommodate the filter preform; and
   forming the ESC-bush-filter assembly which is a sintered body in which the ESC, a bush, and a filter are integrated with each other, by accommodating the bush preform in which the filter preform is accommodated in the filter accommodation part, in the first accommodation part and then performing co-sintering.

16. The method of claim 15, wherein the ESC, the bush, and the filter are made of ceramic materials with the same main component.

17. The method of claim 15, wherein the filter preform comprises a pore former.

18. The method of claim 17, wherein the forming of the ESC-bush-filter assembly comprises converting the filter preform into a porous sintered body by removing the pore former in the filter preform.

19. The method of claim 15, wherein the forming of the ESC-bush-filter assembly comprises converting the ESC preform and the bush preform into dense sintered bodies comprising no pores.

20. A susceptor comprising:
   an electrostatic chuck (ESC) for chucking a substrate by using electrostatic force, and comprising a first accommodation part formed in a surface opposite to a surface on which the substrate is chucked, and a gas channel connected to the first accommodation part;
   a base plate coupled to the surface of the ESC in which the first accommodation part is formed, and comprising a second accommodation part formed at a position corresponding to the first accommodation part of the ESC, and a gas channel connected to the second accommodation part;
   a bush-filter assembly disposed between the gas channel formed in the ESC and the gas channel formed in the base plate; and
   an adhesive layer disposed between the ESC and the base plate to couple the ESC to the base plate,
   wherein the bush-filter assembly comprises:
   a bush provided as a dense ceramic sintered body comprising a gas channel through which a gas flows, and a filter accommodation part formed at a side of the gas channel to accommodate a filter; and
   the filter provided as a porous ceramic sintered body through which a gas passes, and at least partially accommodated in the filter accommodation part so as to be sinter-bonded to and integrated with the bush,
   wherein the bush and the filter are made of ceramic materials with the same main component,
   wherein a portion of the bush-filter assembly is accommodated in the first accommodation part formed in the ESC so as to be coupled to the ESC, and a remaining portion of the bush-filter assembly is at least partially accommodated in and coupled to the second accommodation part formed in the base plate, and
   wherein an interface between the bush and the filter is formed by directly sinter-bonding the bush to the filter without using an adhesive layer made of a heterogeneous material.

* * * * *